(12) United States Patent
Jeon et al.

(10) Patent No.: US 8,614,464 B2
(45) Date of Patent: Dec. 24, 2013

(54) NITRIDE-BASED SEMICONDUCTOR DEVICE AND METHOD FOR MANUFACTURING THE SAME

(75) Inventors: Woochul Jeon, Gyeonggi-do (KR); Kiyeol Park, Gyeonggi-do (KR); Younghwan Park, Seoul (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 4 days.

(21) Appl. No.: 13/049,444

(22) Filed: Mar. 16, 2011

(65) Prior Publication Data
US 2012/0145995 A1 Jun. 14, 2012

(30) Foreign Application Priority Data
Dec. 9, 2010 (KR) .................. 10-2010-0125282

(51) Int. Cl.
*H01L 27/148* (2006.01)
*H01L 29/66* (2006.01)
*H01L 21/02* (2006.01)

(52) U.S. Cl.
USPC ........................ 257/223; 257/190; 257/199

(58) Field of Classification Search
USPC ............. 257/20, 190, E29.024, 24, 195, 199, 257/E21.403, 223
See application file for complete search history.

(56) References Cited

U.S. PATENT DOCUMENTS

| | | | | |
|---|---|---|---|---|
| 2002/0180049 A1* | 12/2002 | Johnson | ........................ | 257/758 |
| 2003/0098462 A1* | 5/2003 | Yoshida | ........................ | 257/183 |
| 2005/0212049 A1* | 9/2005 | Onodera | ........................ | 257/355 |
| 2006/0273324 A1* | 12/2006 | Asai et al. | ........................ | 257/79 |
| 2007/0290228 A1* | 12/2007 | Yoshida | ........................ | 257/190 |
| 2009/0098677 A1* | 4/2009 | Shibata | ........................ | 438/47 |
| 2011/0057286 A1* | 3/2011 | Jeon et al. | ........................ | 257/476 |
| 2012/0007049 A1* | 1/2012 | Jeon et al. | ........................ | 257/20 |

FOREIGN PATENT DOCUMENTS

| | | |
|---|---|---|
| JP | 2005-217049 A | 8/2005 |
| KR | 2001-0098142 A | 11/2001 |
| KR | 10-2005-0084685 | 8/2005 |
| WO | WO 2007/034547 A1 | 3/2007 |

OTHER PUBLICATIONS

Korean Office Action issued in Korean Patent Application No. 10-2010-0125282 dated Apr. 27, 2012.

* cited by examiner

*Primary Examiner* — Walter H Swanson
*Assistant Examiner* — Wilner Jean Baptiste
(74) *Attorney, Agent, or Firm* — McDermott Will & Emery LLP

(57) ABSTRACT

Disclosed herein are a nitride-based semiconductor device and a method for manufacturing the same. The nitride-based semiconductor device includes: a base substrate having a front surface and a rear surface opposite to the front surface; an epitaxial growth film formed on the front surface of the base substrate; a semiconductor layer formed on the rear surface of the base substrate; and an electrode structure body provided on the epitaxial growth film.

8 Claims, 3 Drawing Sheets

100

100

NITRIDE-BASED SEMICONDUCTOR DEVICE AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2010-0125282, entitled "Nitride-based Semiconductor Device and Method for Manufacturing the Same" filed on Dec. 9, 2010, which is hereby incorporated by reference in its entirety into this application.

BACKGROUND OF THE INVENTION

1. Technical Field

The present invention relates to a nitride-based semiconductor device and a method for manufacturing the same, and more particular, to a nitride-based semiconductor device and a method for manufacturing the same capable of reducing a reverse leakage current and increasing a withstand voltage.

2. Description of the Related Art

In general, a group III-nitride-based semiconductor including group III element such as gallium (Ga), aluminum (Al), and indium (In), and nitrogen (N) has characteristics such as a wide energy band gap, a high electron mobility, a saturation electron velocity, and a high thermal chemical stability. A nitride-based field effect transistor (N-FET) based on this group III-nitride-based semiconductor is manufactured by materials such as semiconductor materials having a wide energy band gap, for example, gallium nitride (GaN), aluminum gallium nitride (AlGaN), indium gallium nitride (InGaN), aluminum indium gallium nitride (AlINGaN), etc.

General nitride-based field effect transistors each include a base substrate, an epitaxial growth film formed on the base substrate, and a Schottky electrode and an ohmic electrode disposed on the epitaxial growth film. In this nitride-based semiconductors, a 2-dimensional electron gas (2DEG) used as a movement route of current is generated in the epitaxial growth film. The nitride-based semiconductor can implement forward and reverse operations by using the 2-dimensional electron as a carrier movement route.

A Schottky diode device of the above described nitride-based semiconductor devices utilizes a Schottky junction between metal and semiconductor. This nitride-based semiconductor device allows fast switching operation and driving by low forward voltage. A nitride-based semiconductor device such as the Schottky diode has a Schottky electrode for Schottky contact as an anode electrode and an ohmic electrode for ohmic contact as a cathode electrode.

However, in the Schottky diode having this structure, leakage current is generated from the Schottky electrode to the base substrate at the time of reverse operation. To prevent the reverse leakage current, a silicon substrate, a silicon carbide substrate, a spinel substrate, or a sapphire substrate, each of which has a resistance value of 1 kΩ or more, is used as a base substrate of the general nitride-based semiconductor device. However, it is impossible to fundamentally prevent the generation of the leakage current even when using of the above substrate having a high resistance value. Also, the above substrate having such a high resistance value is relatively expensive. Especially, a silicon wafer having a high resistance value of 1 kΩ or more, which is generally and widely used, is significantly expensive compared with other substrates. This causes an increase in the manufacturing costs of the nitride-based semiconductor device.

SUMMARY OF THE INVENTION

An object of the present invention is to provide a nitride-based semiconductor device capable of preventing reverse leakage current and increasing withstand voltage.

Another object of the present invention is to provide a nitride-based semiconductor device capable of reducing the manufacturing costs.

Another object of the present invention is to provide a method for manufacturing a nitride-based semiconductor device capable of preventing reverse leakage current and increasing withstand voltage.

Another object of the present invention is to provide a method for manufacturing a nitride-based semiconductor device capable of reducing the manufacturing costs.

According to an exemplary embodiment of the present invention, there is provided a nitride-based semiconductor device, including: a base substrate having a front surface and a rear surface opposite to the front surface; an epitaxial growth film formed on the front surface of the base substrate; a semiconductor layer formed on the rear surface of the base substrate; and an electrode structure body provided on the epitaxial growth film.

The base substrate may provide a diode structure together with the semiconductor layer.

The base substrate may provide a diode structure together with the semiconductor layer, and the semiconductor layer may include a semiconductor layer having impurities having a different conductive type from the base substrate, the diode structure having an NP diode structure or a PN diode structure.

The base substrate may provide a diode structure together with the semiconductor layer, and the semiconductor layer may include a first semiconductor layer having a different conductive type from the base substrate and a second semiconductor layer covering the first semiconductor layer and having the same conductive type as the base substrate, the diode structure having an NPN diode structure or a PNP diode structure.

The base substrate may provide a diode structure together with the semiconductor layer, and the base substrate may include a silicon substrate having a resistance value below 1 kΩ, the diode structure having a resistance value of 1 kΩ or more.

The base substrate may provide a diode structure together with the semiconductor layer, the diode structure interrupting current flow to the base substrate from the electrode structure body when the nitride-based semiconductor device is reversely operated.

The nitride-based semiconductor device may further include a buffer layer interposed between the base substrate and the epitaxial growth film, the buffer layer including a super-lattice layer.

The epitaxial growth film may include a first nitride layer on the base substrate and a second nitride layer disposed on the first nitride layer and having a wider energy band gap than the first nitride layer, a 2-dimensional electron gas (2DEG) being generated at a boundary between the first nitride layer and the second nitride layer.

The electrode structure body may include a Schottky electrode disposed on the epitaxial growth film, an ohmic electrode spaced from the Schottky electrode on the epitaxial growth film, a gate electrode disposed on the epitaxial growth film, a source electrode disposed at one side of the gate electrode on the epitaxial growth film, and a drain electrode disposed at the other side of the gate electrode.

The front surface and the rear surface may be polished surfaces subjected to polishing treatment.

According to another exemplary embodiment of the present invention, there is provided a method for manufacturing a nitride-based semiconductor device, including: preparing a base substrate having a front surface and a rear surface opposite to the front surface; forming a semiconductor layer on the rear surface of the base substrate to form a diode structure; forming an epitaxial growth film on the front surface of the base substrate; and forming an electrode structure body on the epitaxial growth film.

The forming of the diode structure may include doping a semiconductor layer having a different conductive type from the base substrate on the rear surface.

The forming of the diode structure may include doping a first semiconductor layer having a different conductive type from the base substrate on the rear surface, and doping a second semiconductor layer having the same conductive type as the base substrate on the first semiconductor layer.

The forming of the diode structure may include injecting semiconductor impurity ions having a different conductive type from the base substrate into the base substrate.

The preparing of the base substrate may include preparing a silicon substrate, both surfaces of which are subjected to polishing treatment.

The preparing of the base substrate may include preparing a silicon substrate having a resistance value below 1 kΩ, and the forming of the diode structure may include manufacturing a substrate laminate having a resistance value of 1 kΩ or more.

The diode structure may use a leakage current preventing body for interrupting current flow to the base substrate from the electrode structure body when the nitride-based semiconductor device is reversely operated.

The forming of the epitaxial growth film may include growing a first nitride layer on the front surface by using the base substrate as a seed layer and growing a second nitride layer having a wider energy band gap than the first nitride layer on the first nitride layer by using the first nitride layer as a seed layer, a 2-dimensional electron gas (2DEG) being generated at a boundary between the first nitride layer and the second nitride layer.

The forming of the electrode structure body may include forming a Schottky electrode on the epitaxial growth film and forming an ohmic electrode spaced from the Schottky electrode on the epitaxial growth film.

DESCRIPTION OF THE PREFERRED EMBODIMENTS

Figure 1:
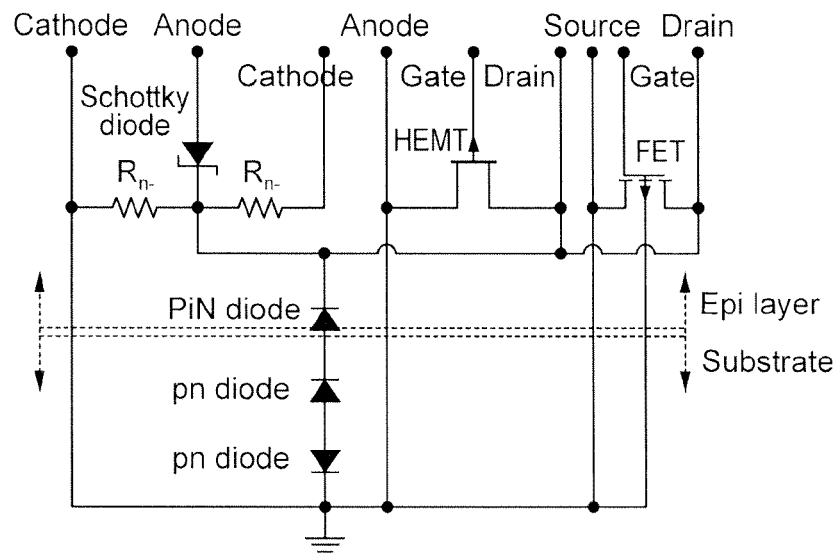
FIG. 1 is a circuit view showing a nitride-based semiconductor device according to the present invention.

Various advantages and features of the present invention and methods for accomplishing them will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the present specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

In addition, the embodiments described in the present specification will be described with reference to cross section views and/or plan views as exemplary views. In the drawings, the thicknesses of layers and regions are exaggerated for effective description of technical contents. Accordingly, shapes of the exemplary views may be changed by manufacturing techniques and/or allowable errors. The embodiments of the present invention are not limited to drawn specific shapes, but include changes of shapes generated according to the manufacturing process. For example, an etch region drawn at a right angle may be rounded or may have a certain curvature. Therefore, the regions viewed in the drawings have rough attributes, and the configurations of the regions viewed in the drawings are for illustrating specific forms but not limiting the scope of the present invention.

Hereinafter, a nitride-based semiconductor device and a method for manufacturing the same according to the present invention will be described in detail with reference to the accompanying drawings.

Figure 2:
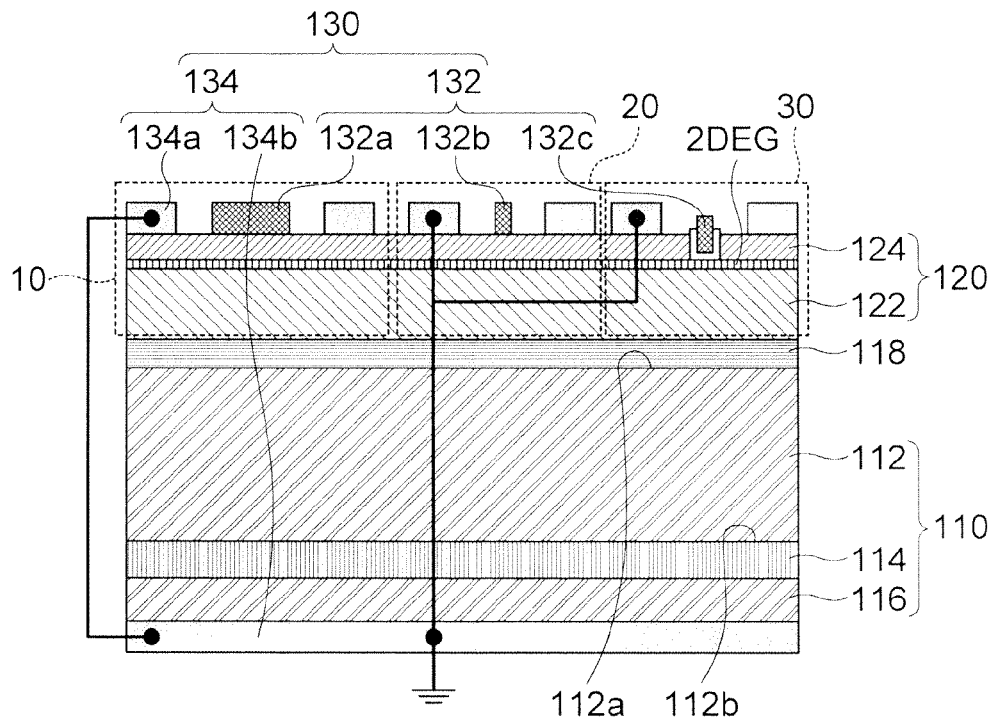
FIG. 2 is a side view showing a nitride-based semiconductor device according to the present invention.

FIG. 1 is a circuit view showing a nitride-based semiconductor device according to the present invention, and FIG. 2 is a side view showing a nitride-based semiconductor device according to the present invention.

Referring to FIGS. 1 and 2, a nitride-based semiconductor device 100 according to the present invention may be a power device having a Schottky barrier diode (SBD) structure 10 and a transistor structure. The transistor structure may include at least one of a high electron mobility transistor (HEMT) 20 and a field effect transistor (FET) 30.

The nitride-based semiconductor device 100 may include a substrate structure body 110, an epitaxial growth film 120, and an electrode structure body 130.

The substrate structure body 110 may be used as a base for forming the epitaxial growth film 120 and the electrode structure body 130. For example, the substrate structure body 110 may have a base substrate 112, a first semiconductor layer 114, and a second semiconductor layer 116. The base substrate 112 may have a front surface 112a and a rear surface 112b opposite to the front surface 112a. The front surface 112a and the rear surface 112b may be surfaces subjected to polishing treatment. Only the front surface 112a may be selectively subjected to polishing treatment. Various kinds of semiconductor substrates may be used as the base substrate 112. For example, the base substrate 112 may be an N-type semiconductor silicon wafer. In another example, the base substrate 112 may be a P-type semiconductor silicon wafer.

The first semiconductor layer 114 and the second semiconductor layer 116 may cover the rear surface 112b of the base substrate 112 in order. The first semiconductor layer 114 may be a semiconductor layer having a different conductive type from the base substrate 112, and the second semiconductor layer 116 may be a semiconductor layer having the same conductive type as the base substrate 112. Therefore, when the base substrate 112 is an N-type semiconductor silicon wafer, the first semiconductor layer 114 may be a P-type semiconductor layer and the second semiconductor layer 116 may be an N-type semiconductor layer. In this case, the substrate structure body 110 may constitute an NPN junction diode structure. Meanwhile, when the base substrate 112 is a P-type semiconductor silicon wafer, the first semiconductor layer 114 may be an N-type semiconductor layer and the second semiconductor layer 116 may be a P-type semiconductor layer. In this case, the substrate structure body 110 may constitute a PNP junction diode structure.

Also, a buffer layer 118 may be interposed between the substrate structure body 110 and the epitaxial growth film 120. For example, the substrate structure body 110 may further include a buffer layer 118 covering the front surface 112*a* of the base substrate 112. The buffer layer 118 may have a super-lattice layer structure. The super-lattice layer structure may have a structure where thin films of different materials are alternately laminated. For example, the buffer layer 118 may have a multi-layer structure where an insulator layer and a semiconductor layer are alternately grown. The above buffer layer 118 is capable of reducing the generation of defects due to lattice mismatch between the substrate structure body 110 and the epitaxial growth film 120.

Herein, a silicon substrate having a relatively low resistance value may be used as the base substrate 112. More specially, in a manufacturing process of a semiconductor device, it may be preferable to use a silicon wafer having a high resistance value as a base substrate for formation of device in order to prevent the leakage current and increase the withstand voltage of the device at the operating time of the device. However, since the silicon wafer having a resistance value of 1 kΩ or more is significantly expensive in comparison with a silicon wafer having a resistance value below 1 kΩ, the manufacturing costs of the device increases. Accordingly, it may be preferable to use a silicon wafer having a low resistance below about 1 kΩ as the base substrate 112 and form the substrate structure body 110 to have a resistance value of 1 kΩ or more by the diode structure.

Meanwhile, the present embodiment takes an example of a case where the substrate structure body 110 has the NPN diode structure or the PNP diode structure, but the substrate structure body 110 may have various forms of diode structures. For example, the substrate structure body 110 may have an NP diode structure where an N-type silicon substrate is used as the base substrate 112 and a PN diode structure where a P-type silicon substrate is used as the base substrate 112.

The epitaxial growth film 120 may cover the front surface 112*a* of the base substrate 112. For example, the epitaxial growth film 120 may include a first nitride layer 122 and a second nitride layer 124 sequentially laminated on the front surface 112*a* of the base substrate 112. The second nitride layer 124 may consist of materials having a wider energy band gap than the first nitride layer 122. In addition, the second nitride layer 124 may consist of materials having a different lattice constant from the first nitride layer 122.

For example, the first nitride layer 122 and the second nitride layer 124 may be a film including group III-nitride-based materials. More specially, the first nitride layer 122 may be formed of any one of gallium nitride (GaN), aluminum gallium nitride (AlGaN), indium gallium nitride (InGaN), and indium aluminum gallium nitride (InAlGaN), and the second nitride layer 124 may be formed of any one of gallium nitride (GaN), aluminum gallium nitride (AlGaN), indium gallium nitride (InGaN), and indium aluminum gallium nitride (InAlGaN). For example, the first nitride layer 122 may be a gallium nitride (GaN) film and the second nitride layer 124 may be an aluminum gallium nitride (AlGaN) film.

A 2-dimensional electron gas (2DEG) may be generated at a boundary between the first nitride layer 122 and the second nitride layer 124 in the epitaxial growth film 120. The current may flow through the 2-dimensional electron gas (2DEG) at the operating time of the nitride-based semiconductor device 100. Herein, the current may move through the 2-dimensional electron gas (2DEG) in the Schottky barrier diode 10 and transistor structures 20 and 30. To achieve this, the Schottky barrier diode 10 may share the 2-dimensional electron gas (2DEG) with the transistor structures 20 and 30.

The electrode structure body 130 may include a Schottky electrode 132 and an ohmic electrode 134 disposed on the epitaxial growth film 120. The Schottky electrode 132 may include first to third Schottky electrodes 132*a*, 132*b* and 132*c*, and the ohmic electrode 134 may include first ohmic electrodes 134*a* and a second ohmic electrode 134*b*. The first to third Schottky electrodes 132*a*, 132*b* and 132*c* may be spaced from each other above the epitaxial growth film 120. The first ohmic electrodes 134*a* may be disposed at both sides of each of the first to third Schottky electrodes 132*a*, 132*b* and 132*c*, respectively. The second ohmic electrode 134*b* may cover a lower surface of the substrate structure body 110.

The first Schottky electrode 132*a*, and the first ohmic electrodes 134*a* disposed at both sides of the first Schottky electrode 132*a* may constitute the Schottky barrier diode 10. The first Schottky electrode 132*a* may be used an anode of the Schottky barrier diode 10, and the first ohmic electrodes 134*a* may be used as a cathode of the Schottky barrier diode 10. The second Schottky electrode 132*b* and the first ohmic electrodes 134*a* disposed at both sides of the second Schottky electrode 132*b* may constitute the high electron mobility transistor 20. The second Schottky electrode 132*b* may be used as a gate electrode of the high electron mobility transistor 20, and the first ohmic electrodes 134*a* disposed at both sides of the second Schottky electrode 132*b* may be used as a source electrode and a drain electrode respectively. The third Schottky electrode 132*c* and the first ohmic electrodes 134*a* disposed at both sides of the third Schottky electrode 132*c* may constitute the field effect transistor 30. The third Schottky electrode 132*c* may be used as a gate electrode of the field effect transistor 30 and the first ohmic electrodes 134*a* disposed at both sides of the third Schottky electrode 132*c* may be used as a source electrode and a drain electrode of the field effect transistor 30, respectively.

The second ohmic electrode 134*b* may cover the lower surface of the substrate structure body 110, for example, an exposed surface of the second semiconductor layer 116 in a uniform thickness. The second ohmic electrode 134*b* may form ohmic contact with the first semiconductor layer 114 of the substrate structure body 110. The second ohmic electrode 134*b* may be electrically connected to the first ohmic electrodes 134*a*. Accordingly, a voltage may be simultaneously applied to the first and second ohmic electrodes 134*a* and 134*b* at the time of forward operation and reverse operation.

The nitride-based semiconductor device 100 has the following breakdown voltage characteristic. For example, the lateral breakdown voltage characteristic may be a breakdown voltage between the Schottky junction and the ohmic junction when a reverse voltage is applied between the anode and the cathode. On the other hand, the vertical breakdown voltage is determined by the diode structure. Herein, the vertical breakdown voltage may be larger than the lateral breakdown voltage by the above diode structure. Herein, the vertical breakdown voltage may be adjusted by doping concentration and depth of the first and second semiconductor layers 114 and 116 formed in the base substrate 112.

As described above, the nitride-based semiconductor device 100 according to the present embodiment may include the substrate structure body 110 having the diode structure, the epitaxial growth film 120 having the 2-dimensional electron gas (2DEG), and the electrode structure body 130. The diode structure may be an NPN junction diode or a PNP junction diode. Accordingly, the diode structure may be used as a diode for interrupting current flow to the substrate structure body 110 from the Schottky electrode 132 when a reverse voltage is applied to the Schottky electrode 132 and the ohmic electrode 134 of the electrode structure body 130. Thus, the nitride-based semiconductor device 100 according to the present invention is capable of increasing withstand voltage and increasing mass production efficiency by preventing the reverse leakage current at the off-operating time of the nitride-based semiconductor device 100 according to the present invention.

Also, the nitride-based semiconductor device 100 according to the present embodiment may include the substrate structure body 110 having the diode structure, the epitaxial growth film 120 having the 2-dimensional electron gas (2DEG), and the electrode structure body 130. Herein, the substrate structure body 110 may be formed to have a high resistance value of 1 kΩ or more by using the base substrate 112, such as, a relatively low-priced silicon substrate below 1 kΩ, as a base. Accordingly, the nitride-based semiconductor device 100 according to the present invention is capable of fundamentally preventing reverse leakage current and reducing the manufacturing costs of the device, compared with a device using a substrate of relatively high resistance value, by employing the substrate structure body 110 having the diode structure for interrupting the reverse leakage current.

Hereinafter, the manufacturing method of a nitride-based semiconductor device according to the present invention is described in detail below. Herein, duplicate contents with respect to the nitride-based semiconductor device 100 according to the present embodiment may be omitted or simplified. Also, the manufacturing method described below explains a manufacturing method of a nitride-based semiconductor device having an NPN junction diode structure, and the description with respect to the manufacturing method of the nitride-based semiconductor device having PNP, NP or PN junction diode structure is omitted.

Figure 3:
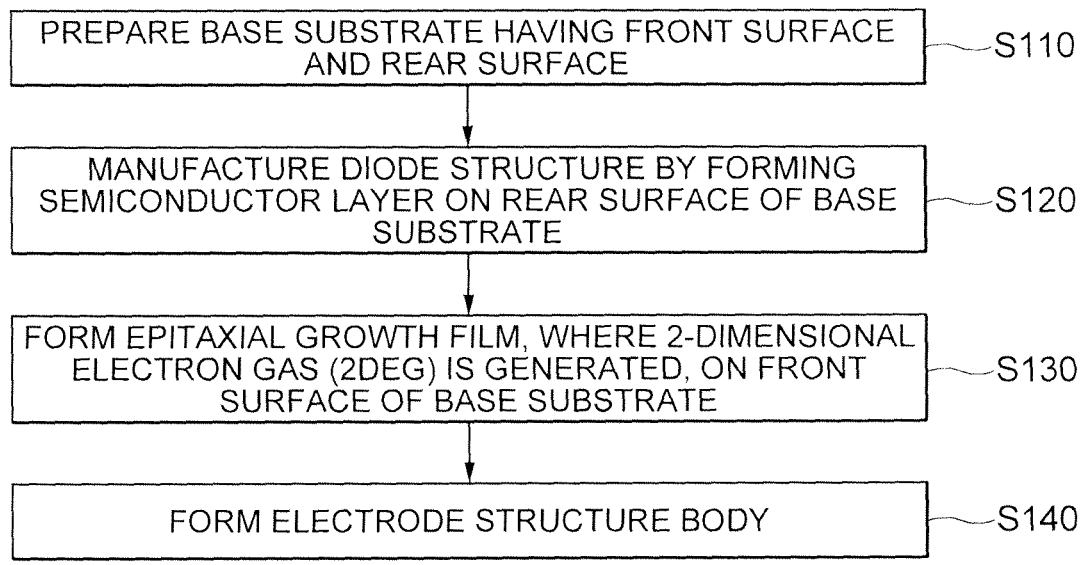
FIG. 3 is a sequence view showing a method for manufacturing a nitride-based semiconductor device according to the present invention.
Figure 4:
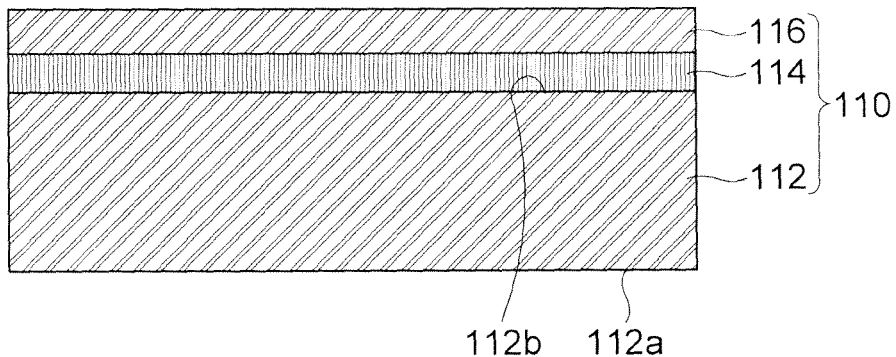
FIGS. 4 to 6 are views showing a process for manufacturing a nitride-based semiconductor device according to the present invention.
Figure 5:
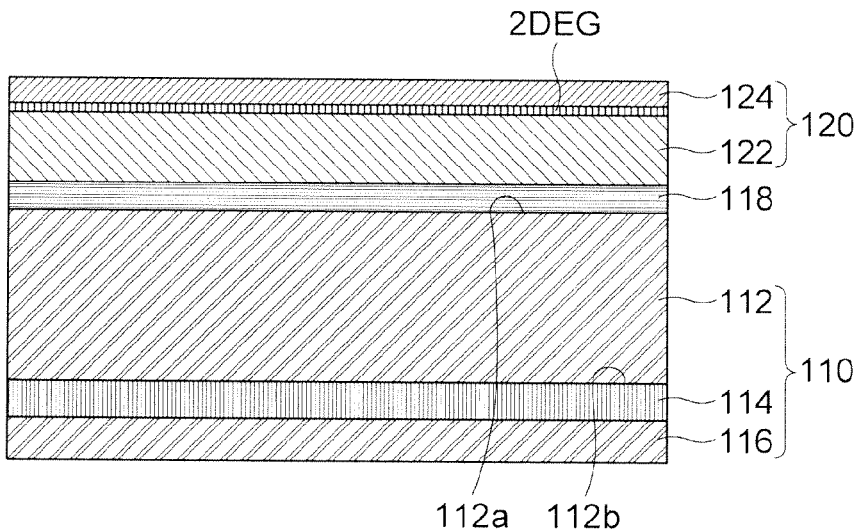
Figure 6:
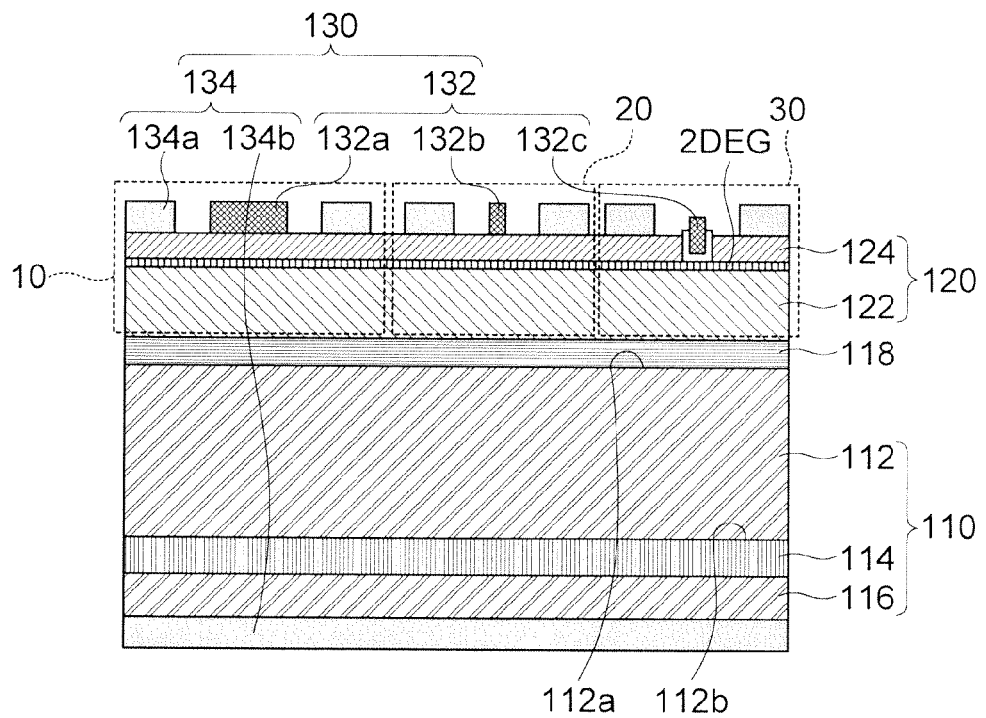

FIG. 3 is a sequence view showing a method for manufacturing a nitride-based semiconductor device according to the present invention. FIGS. 4 to 6 are views showing a process for manufacturing a nitride-based semiconductor device according to the present invention.

Referring to FIGS. 3 and 4, a base substrate 112 having a front surface 112a and a rear surface 112b may be prepared (S110). For example, the preparing of the base substrate 112 may include preparing an N-type silicon wafer, both surfaces of which are subjected to polishing treatment. In a general silicon wafer, only one of the front surface and the rear surface is subjected to polishing treatment selectively. Therefore, a device structure is formed by sequentially depositing thin films on the polished surface of the silicon wafer in a general manufacturing process of the device. However, the present invention may prepare a silicon wafer, both surfaces of which are subjected to polishing treatment, as the base substrate 112. In this case, a thin film forming process is effectively performed on both of the front surface 112a and the rear surface 112b opposite to the front surface 112a of the base substrate 112.

Herein, a substrate having a low resistance value may be used as the base substrate 112. More specially, any one of a silicon substrate, a silicon carbide substrate, spinel substrate, and a sapphire substrate, each of which has a high resistance value of about 1 kΩ or more, is used, in order to prevent the reverse leakage current of the general nitride-based semiconductor device 110. However, the above substrates are relatively expensive, particularly the silicon substrate having a high resistance value of 1 kΩ or more. This may cause an increase in the manufacturing costs of the nitride-based semiconductor device. The substrate structure body 110 is manufactured by using an N-type silicon substrate having a resistance value of relatively below 1 kΩ as a base and implanting P-type impurity ions in the N-type silicon substrate. Therefore, it is possible to reduce the manufacturing costs of the nitride-based semiconductor device 100 according to the present invention.

A semiconductor layer is formed on the rear surface 112b of the base substrate 112 to manufacture a diode structure (S120). For example, the manufacturing of the diode structure may include performing a P-type impurity ion doping treatment on the rear surface 112b to form a P-type semiconductor layer (i.e., a first semiconductor layer 114) on the rear surface 112b of the base substrate 112, and performing an N-type impurity ion doping treatment on the first semiconductor layer 114 to form an N-type semiconductor layer (i.e., a second semiconductor layer 116) on the first semiconductor layer 114.

In another example, the manufacturing of the diode structure may include injecting the P-type impurity ions in the rear surface 112b to form the P-type impurity semiconductor layer in the base substrate 112. While the P-type impurity ions are injected, the injection strength of the P-type impurity ions may be controlled so that both surfaces of the P-type impurity semiconductor layer are covered by the N-type semiconductor layer at a predetermined depth in the base substrate 112.

In still another example, the manufacturing of the diode structure may include forming a P-type semiconductor layer (i.e., the first semiconductor layer 114) on the rear surface 112b by using the base substrate 112 as a seed layer, and forming an N-type semiconductor layer (i.e., the semiconductor layer 116) on the first semiconductor layer 114 by using the first semiconductor layer 114 as a seed layer.

Referring to FIGS. 3 and 5, an epitaxial growth film 120, within which 2-dimensional electron gas (2DEG) is generated, may be formed on the front surface 112a of the base substrate 112 (S130). The forming of the epitaxial growth film 120 may include forming a first nitride layer 122 on the front surface 112a of the base substrate 112 and forming a second nitride layer 124 on the first nitride layer 122. For example, the forming of the epitaxial growth film 120 may be performed by epitaxially growing the first nitride layer 122 using the substrate structure body 110 as a seed layer and epitaxially growing the second nitride layer 124 using the first nitride layer 122 as a seed layer.

At least one of a molecular beam epitaxial growth process, an atomic layer epitaxyial growth process, a flow modulation organometallic vapor phase epitaxyial growth process, a flow modulation organometallic vapor phase epitaxyial growth process, and a hybrid vapor phase epitaxial growth process may be used as an epitaxial growth process for forming the first and second nitride layers 122 and 124. At least one of a chemical vapor deposition process and a physical vapor deposition process may be used as a process for forming the first and second nitride layers 122 and 124.

Meanwhile, a buffer layer 118 may be formed on the front surface 112a of the base substrate 112 before forming the epitaxial growth film 120. The forming of the buffer layer 118 may include forming a super-lattice layer on the front surface 112a of the base substrate 112. The forming of the super-lattice layer may be performed by alternately and repeatedly forming insulator layers and semiconductor layers on the front surface 112a of the base substrate 112.

As described above, the epitaxial growth film 120 may be formed by performing a predetermined epitaxial growth process on the front surface 112a of the base substrate 112. This case can solve the problem, such as, impurity diffusion, in comparison with a case where the diode structure is formed on the front surface 112a of the base substrate 112 and then the epitaxial growth film 120 is formed on the diode structure.

Referring to FIGS. 3 and 6, an electrode structure body 130 may be formed (S130). The forming of the electrode structure body 130 may include forming first to third Schottky electrodes 132a, 132b and 132c spaced from each other on the epitaxial growth film 120, and forming first ohmic electrodes 134a disposed at both sides of each of the first to third Schottky electrodes 132a, 132b and 132c. In addition, the forming of the electrode structure body 130 may further include forming a second ohmic electrode 134b covering a lower surface of the substrate structure body 110.

The forming of the electrode structure body 130 may include forming a conductive layer covering the lower surface of the substrate structure body 110 and the upper surface of the epitaxial growth film 120, and selectively patterning the conductive layer covering the upper surface of the epitaxial growth film 120. The forming of the conductive layer may be performed by forming a metal layer including at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn), below the substrate structure body 110 and above the epitaxial growth film 120.

A portion of the metal layer formed on a portion of the epitaxial growth film 120 may be used as the first to third Schottky electrodes 132a, 132b and 132c by Schottky contact with the second nitride layer 124 of the epitaxial growth film 120. Another portion of the metal layer formed at both sides of the first Schottky electrode 132a may be used as the first ohmic electrodes 134a by ohmic contact with the second nitride layer 124. The first Schottky electrode 132a and the first ohmic electrodes 134a formed at both sides of the first Schottky electrode 132a may constitute a Schottky barrier diode 10. The second Schottky electrode 132b and the first ohmic electrodes 134a formed at both sides of the second Schottky electrode 132b may constitute a high electron mobility transistor 20. The third Schottky electrode 132c and the first ohmic electrodes 134a formed at both sides of the third Schottky electrode 132c may constitute a field effect transistor 30. The first and second ohmic electrodes 134a and 134b are electrically connected to each other, and a voltage may be simultaneously applied to the first and second ohmic electrodes 134a and 134b when the nitride-based semiconductor device 100 are forwardly and reversely operated.

As described above, the method for manufacturing the nitride-based semiconductor device according to the present embodiment prepares the substrate structure body 110 having a diode structure, grows the epitaxial growth film 120 on the substrate structure body 110, and forms the electrode structure body 130 on the epitaxial growth film 120. Herein, the diode structure may be used as a diode for blocking current movement from the Schottky electrode 132 of the electrode structure 130 to the substrate structure body 110 when the nitride-based semiconductor device 100 is reversely operated. Accordingly, a method for manufacturing a nitride-based semiconductor device according to the present embodiment is capable of manufacturing a nitride-based semiconductor devices capable of increasing withstand voltage by preventing reverse leakage current, and improving mass-production efficiency.

Further, the method for manufacturing the nitride-based semiconductor device according to the present embodiment manufactures the substrate structure body 110 having the diode structure, grows the epitaxial growth film 120 on the substrate structure body 110, and forms the electrode structure body 130 on the epitaxial growth film 120. The substrate structure body 110 may be formed by performing doping treatment of impurity ions on a relatively low-priced silicon substrate of a low resistance value. Accordingly, the method for manufacturing the nitride-based semiconductor device according to the present embodiment is capable of fundamentally preventing reverse leakage current and reducing the manufacturing costs of the semiconductor device, in comparison with a case where relatively expensive substrates having a high resistance values are used.

Further, the method for manufacturing the nitride-based semiconductor device according to the present embodiment, prepares the base substrate 112, both surfaces of which are subjected to polishing treatment, forms the epitaxial growth film 120 on the front surface 112a of the base substrate 112, and dopes the semiconductor layer for forming the diode structure on the rear surface 112b of the base substrate 112. This case is capable of preventing diffusion of impurities between the first and second semiconductor layers 114 and 116 and the epitaxial growth film 120, in comparison with a case where the epitaxial growth film 120 is formed on a semiconductor layer for the diode structure, thereby improving the formation efficiency of the epitaxial growth film 120.

As described above, the nitride-based semiconductor device according to the present invention is capable of increasing the reverse withstand voltage of the device by preventing reverse leakage current at the off-operating time, and capable of improving mass-production efficiency.

The nitride-based semiconductor device according to the present invention is capable of preventing reverse leakage current fundamentally and reducing the manufacturing costs of device compared with a device employing a silicon substrate of a relatively high resistance value, by constituting a substrate laminate having a diode structure for interrupting reverse leakage current with using a low-priced silicon substrate as a base.

The nitride-based semiconductor device according to the present invention is capable of preventing the diffusion of impurity between an epitaxial growth film and a diode structure, by forming the epitaxial growth film on a front surface of a base substrate and forming the diode structure on a rear surface of the base substrate.

The method for manufacturing a nitride-based semiconductor device according to the present invention is capable of manufacturing a nitride-based semiconductor device having an increase in withstand voltage by preventing reverse leakage current, and capable of improving mass production efficiency.

The method for manufacturing a nitride-based semiconductor device according to the present invention is capable of preventing the reverse leakage current fundamentally and reducing the manufacturing costs of device, in comparison with a case where relatively expensive substrates of high resistance value are used.

The method for manufacturing a nitride-based semiconductor device according to the present invention is capable of preventing the diffusion of impurity between an epitaxial growth film and a diode structure, by forming the epitaxial growth film on a front surface of a base substrate and forming the diode structure on a rear surface of the base substrate such that the epitaxial growth film and the diode structure are compartmentalized by the base substrate therebetween.

The above detail description is for illustrating the present invention. In addition, the above-described contents is only for showing and explaining preferred embodiment of the present invention, and the present invention may be used in a variety of other combinations, changes, and environments. In other words, modifications or corrections are possible within the scope of concepts of the invention set forth in the present embodiment, the scope of equivalents to written disclosures set forth in the present embodiment and/or the scope of techniques or knowledge in the art. The above-described embodiments are for explaining the best for implementing the present embodiment. Implementation to other forms known in the art and various modifications required in specific application fields and uses of the present invention are possible. Accordingly, the above detailed description of the present invention has no intent to limit the present invention by the presented embodiments. Also, the accompanying claims should be construed to include other embodiments.

What is claimed is:

1. A nitride-based semiconductor device, comprising:
   a base substrate having a front surface and a rear surface opposite to the front surface;
   an epitaxial growth film formed on the front surface of the base substrate;
   a semiconductor layer formed on the rear surface of the base substrate, wherein the base substrate provides a diode structure together with the semiconductor layer; and
   an electrode structure body provided on the epitaxial growth film.

2. The nitride-based semiconductor device according to claim 1, wherein the semiconductor layer has a different conductive type from the base substrate, and the diode structure having an NP diode structure or a PN diode structure.

3. The nitride-based semiconductor device according to claim 1, wherein the semiconductor layer includes:
   a first semiconductor layer having a different conductive type from the base substrate; and
   a second semiconductor layer covering the first semiconductor layer and having the same conductive type as the base substrate, and
   the diode structure having an NPN diode structure or a PNP diode structure.

4. The nitride-based semiconductor device according to claim 1, wherein the base substrate includes a silicon substrate, which has a resistance value below 1 k$\Omega$, and the diode structure has a resistance value of 1 k$\Omega$ or more.

5. The nitride-based semiconductor device according to claim 1, further comprising a buffer layer interposed between the base substrate and the epitaxial growth film, the buffer layer including a super-lattice layer.

6. The nitride-based semiconductor device according to claim 1, wherein the epitaxial growth film includes a first nitride layer on the base substrate,
   a second nitride layer disposed on the first nitride layer and having a wider energy band gap than the first nitride layer, and
   a 2-dimensional electron gas (2DEG) being generated at a boundary between the first nitride layer and the second nitride layer.

7. The nitride-based semiconductor device according to claim 1, wherein the electrode structure body includes:
   a Schottky electrode disposed on the epitaxial growth film;
   an ohmic electrode spaced from the Schottky electrode on the epitaxial growth film;
   a gate electrode disposed on the epitaxial growth film;
   a source electrode disposed at one side of the gate electrode on the epitaxial growth film; and
   a drain electrode disposed at the other side of the gate electrode.

8. The nitride-based semiconductor device according to claim 1, wherein the front surface and the rear surface are polished surfaces subjected to polishing treatment.

* * * * *